(12) United States Patent
Hsieh

(10) Patent No.: US 10,506,711 B2
(45) Date of Patent: Dec. 10, 2019

(54) CERAMIC CIRCUIT PLATE AND METHOD OF MAKING SAME

(71) Applicant: Meng-Hsiu Hsieh, Taichung (TW)

(72) Inventor: Meng-Hsiu Hsieh, Taichung (TW)

( * ) Notice: Subject to any disclaimer, the term of this patent is extended or adjusted under 35 U.S.C. 154(b) by 0 days.

(21) Appl. No.: 15/934,494

(22) Filed: Mar. 23, 2018

(65) Prior Publication Data

US 2019/0239346 A1 Aug. 1, 2019

(30) Foreign Application Priority Data

Jan. 26, 2018 (TW) .............................. 107103007 A

(51) Int. Cl.
| | |
|---|---|
| *H05K 1/03* | (2006.01) |
| *H05K 3/46* | (2006.01) |
| *H01L 23/14* | (2006.01) |
| *H01L 23/498* | (2006.01) |
| *H01L 21/48* | (2006.01) |
| *H05K 1/05* | (2006.01) |
| *H05K 3/10* | (2006.01) |
| *H05K 3/44* | (2006.01) |
| *H05K 1/09* | (2006.01) |
| *H05K 3/00* | (2006.01) |
| *H05K 3/18* | (2006.01) |
| *H05K 3/42* | (2006.01) |
| *B22F 1/00* | (2006.01) |

(52) U.S. Cl.
CPC ......... *H05K 1/0306* (2013.01); *H01L 21/486* (2013.01); *H01L 21/4846* (2013.01); *H01L 23/142* (2013.01); *H01L 23/49827* (2013.01); *H05K 1/053* (2013.01); *H05K 1/092* (2013.01); *H05K 3/0061* (2013.01); *H05K 3/105* (2013.01); *H05K 3/44* (2013.01); *H05K 3/4629* (2013.01); *B22F 1/0081* (2013.01); *H05K 3/188* (2013.01); *H05K 3/424* (2013.01); *H05K 2201/0195* (2013.01); *H05K 2203/107* (2013.01)

(58) Field of Classification Search
CPC ........ H05K 1/0306; H05K 1/03; H05K 3/105; H05K 2201/01; H05K 2201/0137; H05K 2201/0335; H05K 1/05; H05K 1/092; H05K 3/0061; H05K 3/4629; H05K 3/445; C04B 41/4558; C04B 41/0036; C04B 41/009
See application file for complete search history.

(56) References Cited

U.S. PATENT DOCUMENTS

| | | | |
|---|---|---|---|
| 5,618,611 A * | 4/1997 | Jin | ......................... C04B 41/009 428/209 |
| 5,725,938 A * | 3/1998 | Jin | ......................... C04B 41/009 428/210 |
| 6,388,230 B1 * | 5/2002 | Nacker | ............... H01L 21/4846 219/121.68 |

(Continued)

*Primary Examiner* — Roshn K Varghese
(74) *Attorney, Agent, or Firm* — Muncy, Geissler, Olds & Lowe, P.C.

(57) ABSTRACT

A ceramic circuit board and a method of making are provided. The ceramic circuit board includes a substrate and a composite material layer. The composite material layer is formed on the substrate and comprises metal oxide powders and ceramic powders. The composite material layer has an interface layer which is transformed from the metal oxide powders by reduction and includes comprises zero-valent metal, lower-valent metal oxide and eutectic mixture reduced from the metal oxide powders of the composite material layer.

6 Claims, 5 Drawing Sheets

(56) References Cited

U.S. PATENT DOCUMENTS

2011/0042699 A1* 2/2011 Park .................... H01L 33/486
                                                            257/98
2011/0079418 A1   4/2011 Furuichi et al.
2013/0337241 A1* 12/2013 Gong ................... C04B 41/009
                                                           428/209

* cited by examiner

CERAMIC CIRCUIT PLATE AND METHOD OF MAKING SAME

BACKGROUND OF THE INVENTION

1. Field of the Invention

The present invention relates to a ceramic circuit board and a method of making the same.

2. Description of the Related Art

A ceramic circuit board employing ceramic substrate with excellent heat dissipation ability and high reliability are widely used in electrical or electronic products, such as high power electrical modules, and high power light emitting diodes.

Several types of techniques have been used for making ceramic circuit boards. For instance, low-temperature co-fired ceramic (LTCC), high-temperature co-fired ceramics (HTCC), direct bonded copper (DBC), and direct plated copper (DPC) processes have been used. The DPC process on metalized ceramic substrate was originally created to replace the DBC process because of its better electrical, thermal and mechanical performance. The entire DPC process basically comprises the steps of defining holes in the ceramic substrate, sputtering a copper film onto the ceramic substrate, forming a dry film onto the copper film, forming a circuit pattern with exposure and development, plating copper leads, removing the dry film and etching the seed metal copper, and so on. Further detailed information can be found in U.S. Patent Pub. No. 2011/0079418.

SUMMARY OF THE INVENTION

The present invention provides a method of making a ceramic circuit board, comprising the following steps: (a). providing a substrate; (b). applying a composite material layer to the substrate, the composite material layer comprising metal oxide powders and ceramic powders; and (c). irradiating at least an area of the composite material layer so as to transform the corresponding metal oxide powders and the ceramic powders located at the irradiated area of the composite material layer into an interface layer by reduction and have the interface layer exposed on the composite material layer. In particular, the interface layer comprises zero-valent metal reduced from the metal oxide powders of the composite material layer, or zero-valent metal, lower-valent metal oxide and eutectic mixture reduced from the metal oxide powders of the composite material layer.

In one embodiment, the making method further includes the steps of providing a plate which is made of metal, and applying a ceramic layer on the plate, wherein the composite material layer is formed on the ceramic layer.

In another embodiment, the making method further includes the step of forming a metallic conductive layer on the interface layer.

This invention further provides a ceramic circuit board, comprising a substrate and a composite material layer formed on the substrate. The composite material layer comprises metal oxide powders and ceramic powders. Moreover, the composite material layer has an interface layer which is transformed from the metal oxide powders by reduction and is exposed on the composite material layer, wherein the interface layer comprises zero-valent metal reduced from the metal oxide powders of the composite material layer, or zero-valent metal, lower-valent metal oxide and eutectic mixture reduced from the metal oxide powders of the composite material layer.

In one embodiment, the ceramic circuit board includes a plate and a ceramic layer. The plate is a metallic plate. The ceramic layer is formed on the plate, and the composite material layer is formed on the ceramic layer.

In another embodiment, the ceramic circuit board further includes a metallic conductive layer formed on the interface layer.

In yet another embodiment, the metal oxide powders of the composite material layer comprise a material selected from a group consisting of silver(I) oxide, copper(II) oxide, and nickel(II) oxide.

Compared to the prior art, the ceramic circuit board can be manufactured more quickly with this method. During the manufacturing process, only laser light is employed to irradiate the aforesaid composite material layer to obtain the interface layer, for further bonding with circuit metal using electroplating. Thus, the ceramic circuit board can be made in a cost-effective way, without using any sputtering deposition apparatus that is needed in the prior art and is relatively expensive and inefficient in manufacture.

BRIEF DESCRIPTION OF THE DRAWINGS

FIG. 7 is a partially cross-sectional view of another ceramic circuit board 100a.

DETAILED DESCRIPTION OF EMBODIMENTS

Figure 1A:
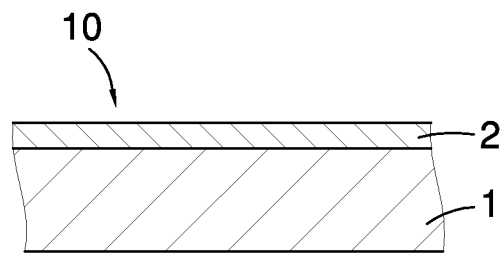
FIGS. 1(A)-1(D) are cross-sectional views of a ceramic circuit board 100 in accordance with a first embodiment of the present invention, illustrating a method of making the ceramic circuit board.
Figure 1B:
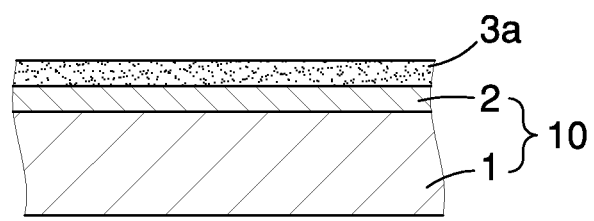
Figure 1C:
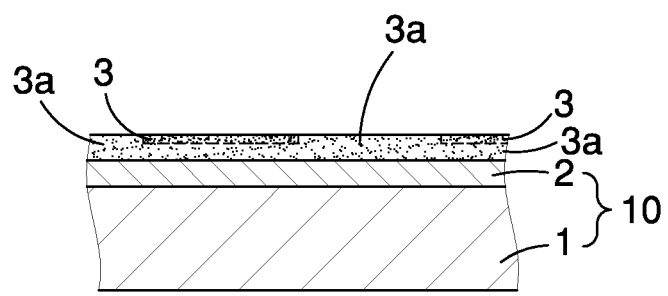

Referring to FIGS. 1(A)-1(C), there is shown a first embodiment of the method of making the ceramic circuit board 100, the method comprising the following steps:

Firstly, as shown in FIG. 1(A), a substrate 10 is provided. The substrate 10 may be made of metal, ceramics, a multi-layered sheet, etc. In this embodiment, the substrate 10 includes a plate 1 and a ceramic layer 2 formed on the plate 1. Preferably, the plate 1 has a thickness of about 0.3 mm to 1.5 mm. The plate 1 may be made of aluminum, aluminum alloy, copper, copper alloy, plastics, Bakelite, polyester (PET), polyimide (PI), etc. The ceramic layer 2 may be made from a material selected from a group consisting of Boron nitride (BN), Aluminum nitride (AlN), Aluminum oxide ($Al_2O_3$) and Silicon carbide (SiC), with a thickness of about 10 μm to 30 μm. Preferably, inorganic conductive powders, such as Graphite powders, may be added in the ceramic layer 2 for enhancing the heat dissipation ability of the ceramic layer 2. In practice, the ceramic powders together with any additives are firstly blended with liquid resin (such as silicone, epoxy). The blend is then applied onto the plate 1 by spraying coating or curtain coating, and thereafter the coated layer is subject to heat treatment and therefore transformed into the ceramic layer 2 under a temperature of about 200° C. The ceramic layer 2 has excellent high voltage durability, insulation property, and heat-dissipation ability.

Next, as shown in FIG. 1(B), a composite material layer 3a is applied on the substrate 10. The composite material layer 3a has materials including metal oxide powders and ceramic powders. In practice, the metal oxide powders and the ceramic powders are firstly mixed together and processed into nanoparticles by spray drying. Afterward, the mixed nanoparticles are further blended with liquid resin (such as silicone, epoxy), and then the blend is applied onto the ceramic layer 2 of the substrate 10 by spray coating or curtain coating. The coated layer is then subject to heat treatment under a temperature of about 200° C. to become the composite material layer 3a. The metal oxide powders of the composite material layer 3a comprise a material selected from a group consisting of silver(I) oxide, copper(II) oxide, and nickel(II) oxide. The ceramic powders of the composite material layer 3a may have materials similar to that of the ceramic layer 2.

Referring to FIG. 1(C), the composite material layer 3a is irradiated with laser light such that any area irradiated by the laser light will be turned into an interface layer 3 in which the corresponding metal oxide powders in that irradiated area are reduced. The interface layer 3 is exposed on the surface of the composite material layer 3a for further metal bonding. The irradiated area may cover the whole or partial surface of the composite material layer 3a. In this embodiment, only part of the surface of the composite material layer 3a is irradiated by the laser light and turned into the interface layer 3, the rest area (which is not irradiated by laser light) remaining as a part of the composite material layer 3a. Since the composite material layer 3a contains ceramic material, it has excellent high voltage durability, insulation property, and heat-dissipation ability, and can be securely bonded to the ceramic layer 2 of the substrate 1 with no problem.

Figure 2:
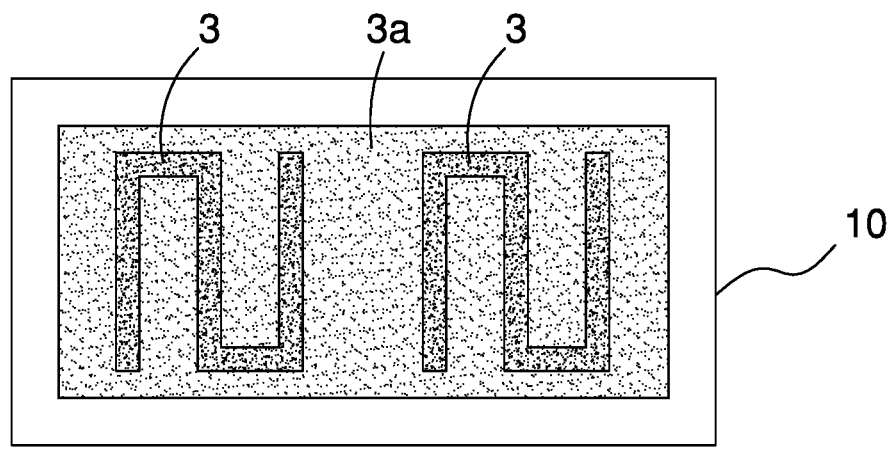
FIG. 2 is a top view of the ceramic circuit board shown in FIG. 1(C)

In this embodiment, the wavelength of the laser light is 1064 nm; however, it should be appreciated that the laser light may have other wavelength, such as 266 nm, 532 nm, 10.6 μm, depending on which kind of metal oxide powders chosen for the composite material layer 3a. Moreover, the laser light may irradiate the composite material layer 3a by scanning More specifically, the laser light may be controlled to scan the composite material layer 3a according to a pattern (such as a circuit pattern) so as to obtain an interface layer 3 identical to the pattern in shape. As shown in FIG. 2, there are two patterned interface layers 3 formed on the composite material layer 3.

As described above, the metal oxide powders and the ceramic powders located at the irradiated area of the composite material layer 3 are reduced by the excitement of the laser light and therefore transformed into zero-valent metal, lower-valent metal oxide and eutectic mixture which together make up the aforesaid interface layer 3. It was not until recently that researchers found out that light can be used to switch the oxidation state from an oxide to a metallic state. That is, some types of metal nanoparticles (such as copper nanoparticles) have the ability to use light to get rid of the oxygen bound to their surfaces, making it possible for metal reduction by light excitation. If the ingredient of the metal oxide powders of the composite material layer 3a is copper(II) oxide (CuO), for example, then when the CuO is irradiated by the laser light, it will be reduced into zero-valent copper (Cu), copper(I) oxide ($Cu_2O$) and eutectic mixture thereof.

Figure 1D:
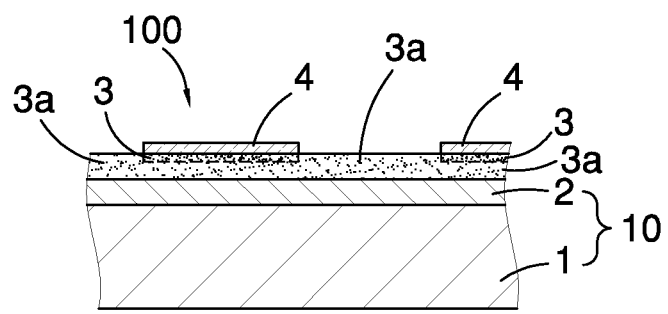
Figure 3:
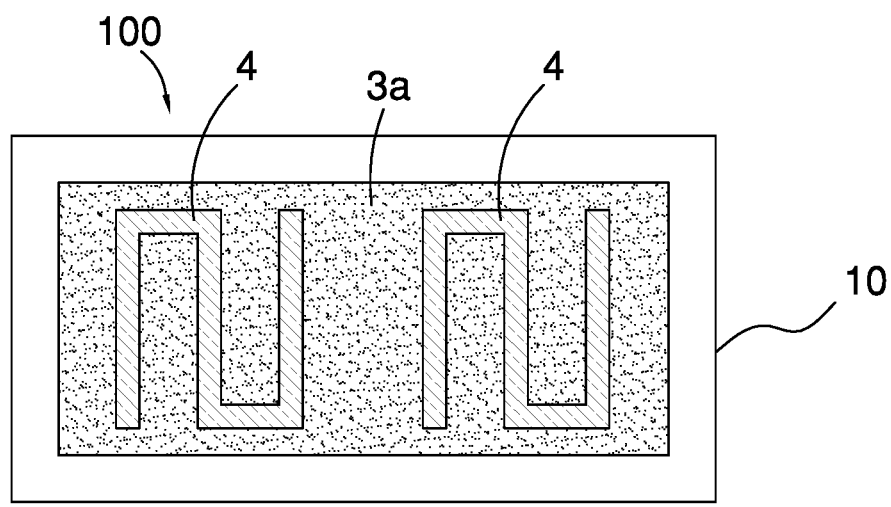
FIG. 3 is a top view of the ceramic circuit board shown in FIG. 1(D)

Preferably, as shown in FIG. 1(D) and FIG. 3, a metallic conductive layer 4 may be applied on the interface layer 3. More specifically, the metallic conductive layer 4 may be coated onto the interface layer 3 by electroplating using a metal material selected from a group consisting of copper, silver, indium, nickel or alloy thereof.

Figure 4A:
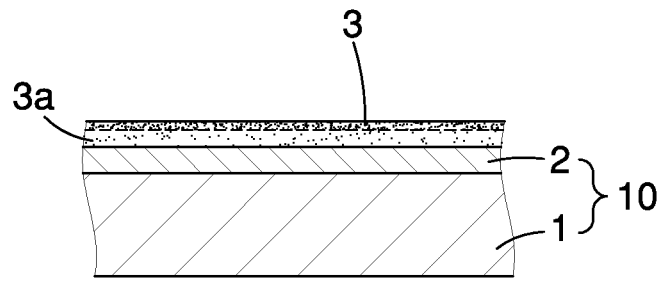
FIGS. 4(A)-4(C) illustrate a method of making the ceramic circuit board in accordance with a second embodiment of the present invention.
Figure 4B:
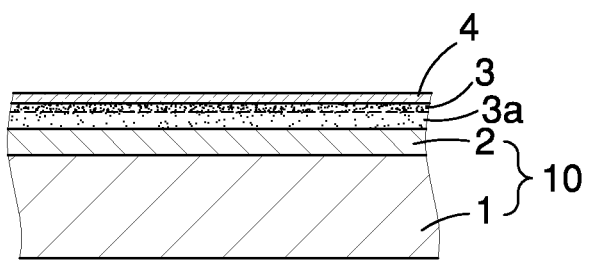
Figure 4C:
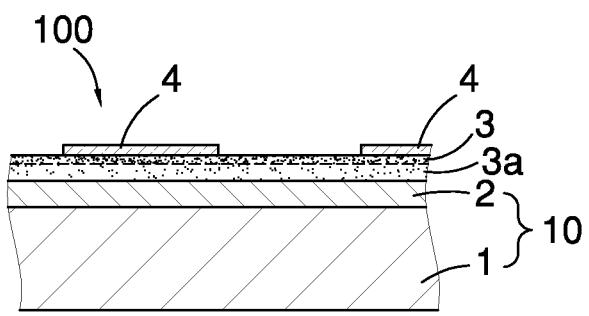
Figure 5:
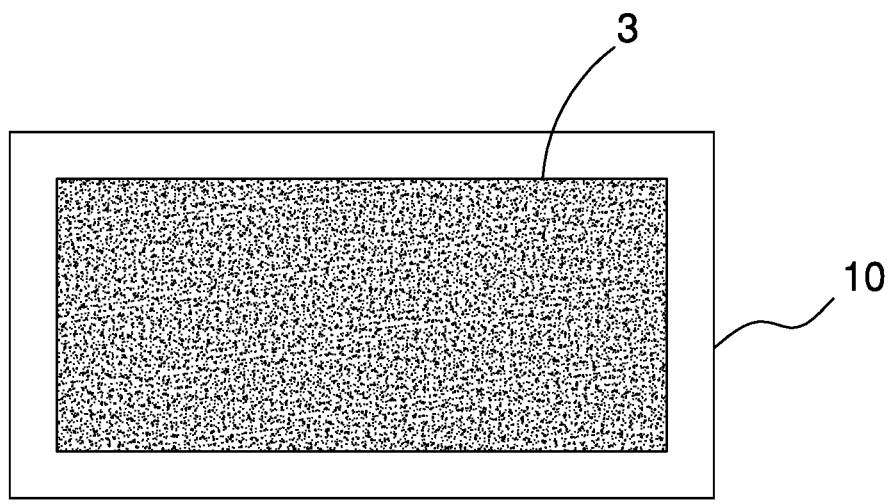
FIG. 5 is a top view of the ceramic circuit board shown in FIG. 4(A)
Figure 6:
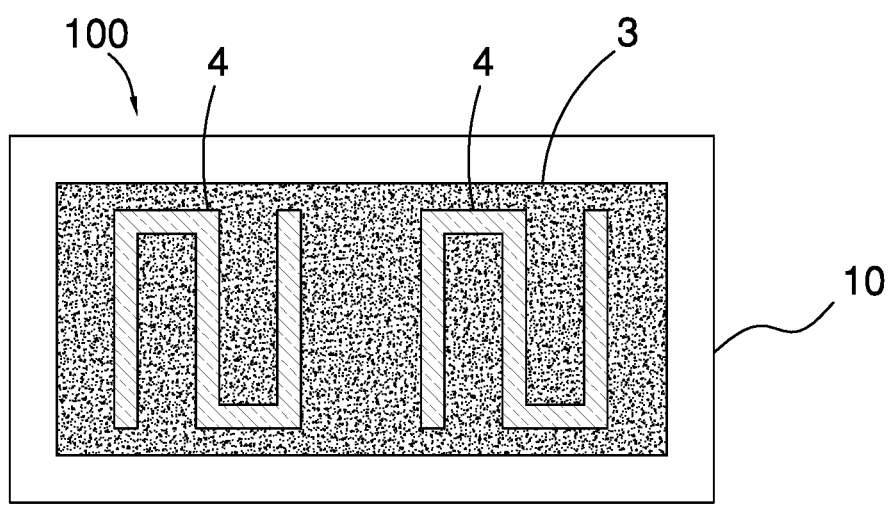
FIG. 6 is a top view of the ceramic circuit board shown in FIG. 4(C)

In another embodiment, as shown in FIG. 4(A) and FIG. 5, when the whole surface of the composite material layer 3a is irradiated by the laser light, the whole surface of the composite material layer 3a is turned to the interface layer 3. As shown in FIG. 4(B), after the electroplating process, the metallic conductive layer 4 is coated onto the whole surface of the composite material layer 3a. Later, referring to FIG. 4(C), the metallic conductive layer 4 is partly etched to form a pattern (such as a circuit pattern), as shown in FIG. 6, using a conventional printed circuit board technology.

In the embodiments shown in FIGS. 1-6, only the top surface of the plate 1 is processed, and therefore the produced ceramic circuit board 100 is single-sided. In the single-sided ceramic circuit board 100, the aforesaid metallic conductive layer 4 is directed to the circuit of the single-sided ceramic circuit board 100.

Figure 7:
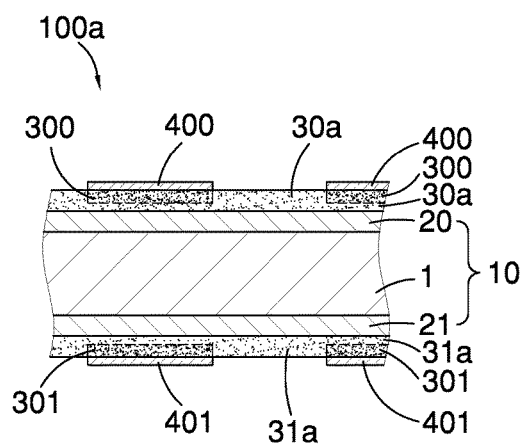

As shown in FIG. 7, when the top and bottom surfaces of the plate 1 are both processed, the produced ceramic circuit board 100a are double-sided and includes the plate 1, an upper ceramic layer 20, a lower ceramic layer 21, an upper composite material layer 30a, a lower composite material layer 31a (both 30a, 31a identical to the aforesaid composite material layer 3a), an upper interface layer 300 and a lower interface layer 301 (both 300, 301 identical to the aforesaid interface layer 3). Preferably, the ceramic circuit board 100a further comprises an upper metallic conductive layer 400 and an lower metallic conductive layer 401. That is, the ceramic circuit board 100a is double-sided with the circuits made up by the upper and lower metallic conductive layers 400, 401.

Figure 8:
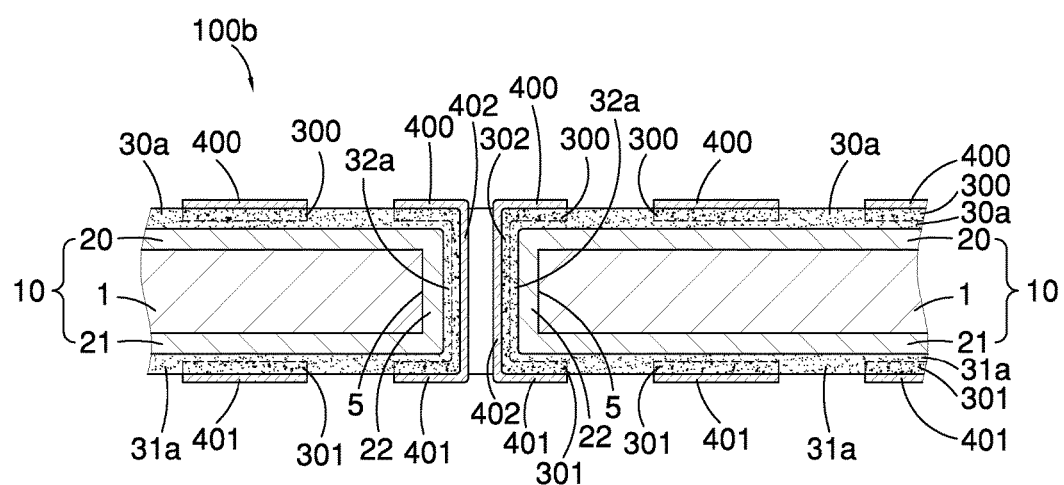
FIG. 8 is a partially cross-sectional view of yet another ceramic circuit board 100b.

Furthermore, as shown in FIG. 8, the plate 1 may define a through hole 5 therein, and both the top and bottom surfaces of the plate 1 are processed to produce the doubled-sided ceramic circuit board 100b with the through hole 5 extending therethrough. In this way, the ceramic circuit board 100b includes a structure similar to that of the ceramic circuit board 100a and further includes the though hole 5, an interior ceramic layer 22 formed on an inner wall of the through hole 5 in the plate 1, and an interior composite material layer 32a formed on the interior ceramic layer 22 (similar to the aforesaid composite material layer 3a). The interior ceramic layer 22 is connected with the upper and lower ceramic layers 20, 21 while the interior composite material layer 32a is connected with the upper and lower composite material layers 30a, 31a. In addition, an interior interface layer 302 is exposed on the surface of the interior composite material layer 32a. The interior interface layer 302 is transformed from the metal oxide powders of the interior composite material layer 32a by reduction and is connected with the upper and lower interface layers 300, 301. Preferably, the double-sided ceramic circuit board 100b may include at least one interior metallic conductive layer 402 formed on the interior interface layer 302 and be connected with the upper and lower metallic conductive layers 400, 401. That is, the double-sided ceramic circuit board 100b has a metal-plated through hole 5 and upper and lower circuits made up by the upper and lower metallic conductive layers 400, 401. The upper and lower circuits are electrically coupled by the interior metallic conductive layer 402.

Furthermore, one or more V-cuts (not shown) may be defined in the bottom and/or top surface of the plate 1 to facilitate the process of dividing the ceramic circuit board 100, 100a or 100b into blocks.

As described above, this making method of the present invention can be used to make a single-sided or double-sided ceramic circuit board. During the process, only laser light is employed to irradiate the aforesaid composite material layer 3a in order to obtain the interface layer 3 for further bonding with metal using electroplating. Thus, the ceramic circuit board can be made in a cost-effective way, without using any sputtering deposition apparatus that is relatively expensive and inefficient in manufacture.

What is claimed is:

1. A ceramic circuit board, comprising: a plate made from a material selected from a group consisting of metal, aluminum, aluminum alloy, copper, copper alloy, plastics, Bakelite, polyester, and polyimide; a ceramic layer formed on the plate and comprising ceramic powders and resins; and a composite material layer formed on the ceramic layer and comprising metal oxide powders, resins and ceramic powders, wherein the composite material layer has an interface layer which is irradiated with laser light and a portion which is not irradiated with the laser light; wherein the composition of the interface layer comprises a metal reduced by the metal oxide powders, the portion covers the entire ceramic layer and has the same composition as that the composite material layer, wherein the interface layer comprises lower-valent metal oxide and eutectic mixture reduced from the metal oxide powders of the composite material layer.

2. The ceramic circuit board of claim 1, further comprising a metallic conductive layer formed on the interface layer.

3. The ceramic circuit board of claim 1, wherein the metal oxide powders of the composite material layer comprise a material selected from a group consisting of silver(I) oxide, copper(II) oxide, and nickel(II) oxide.

4. A ceramic circuit board, comprising: a plate defining a through hole and made from a material selected from a group consisting of metal, aluminum, aluminum alloy, copper, copper alloy, plastics, Bakelite, polyester, and polyimide; an upper ceramic layer formed on top of the plate and whose composition comprises ceramic powders and resins; a lower ceramic layer formed on bottom of the plate and whose composition comprises ceramic powders and resins; an interior ceramic layer formed on an inner wall of the through hole in the plate and connecting the upper and lower ceramic layers and whose composition comprises ceramic powders and resins; an upper composite material layer formed on top of the upper ceramic layer, and comprising metal oxide powders, resins and ceramic powders, wherein the upper composite material layer has an upper interface layer which is irradiated with laser light and an upper portion which is not irradiated with the laser light; a lower composite material layer formed on bottom of the lower ceramic layer, and comprising metal oxide powders, resins and ceramic powders, wherein the lower composite material layer has a lower interface layer which is irradiated with the laser light and a lower portion which is not irradiated with the laser light; and an interior composite material layer formed on the interior ceramic layer, connecting the upper and lower composite material layers, and comprising metal oxide powders, resins and ceramic powders, wherein the interior composite material layer has an interior interface layer which is irradiated with the laser light and an interior portion which is not irradiated with the laser light, wherein the upper interface layer, the interior interface layer and the lower interface layer comprise a-metal reduced by the metal oxide powders; wherein the upper portion covers the entire upper ceramic layer and has the same composition as that the upper composite material layer, the interior portion covers the entire interior ceramic layer and has the same composition as that the interior composite material layer, and the lower portion covers the entire lower ceramic layer and has the same composition as that the lower composite material layer, wherein the upper interface layer comprises lower-valent metal oxide and eutectic mixture reduced from the metal oxide powders of the upper composite material layer; the lower interface layer comprises lower-valent metal oxide and eutectic mixture reduced from the metal oxide powders of the lower composite material layer; and the interior interface layer comprises lower-valent metal oxide and eutectic mixture reduced from the metal oxide powders of the interior composite material layer.

5. The ceramic circuit board of claim 4, wherein the metal oxide powders of the composite material layer comprise a material selected from a group consisting of silver(I) oxide, copper(II) oxide, and nickel(II) oxide.

6. The ceramic circuit board of claim 4, further comprising: an upper metallic conductive layer formed on top of the upper interface layer; a lower metallic conductive layer formed on bottom of the lower interface layer; and an interior metallic conductive layer formed on the interior interface layer and connecting the upper and lower metallic conductive layers.

* * * * *